United States Patent
Janakiraman

(10) Patent No.: US 7,501,965 B2
(45) Date of Patent: Mar. 10, 2009

(54) CORRECTING FOR ERRORS THAT CAUSE GENERATED DIGITAL CODES TO DEVIATE FROM EXPECTED VALUES IN AN ADC

(75) Inventor: Seetharaman Janakiraman, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/755,011

(22) Filed: May 30, 2007

(65) Prior Publication Data
US 2008/0186214 A1   Aug. 7, 2008

Related U.S. Application Data

(60) Provisional application No. 60/888,491, filed on Feb. 6, 2007.

(51) Int. Cl.
*H03M 1/06* (2006.01)
(52) U.S. Cl. .................... 341/118; 341/155
(58) Field of Classification Search .......... 341/115–160
See application file for complete search history.

(56) References Cited

U.S. PATENT DOCUMENTS

| 6,567,021 | B1 * | 5/2003 | Burns | 341/120 |
| 6,611,222 | B1 * | 8/2003 | Murphy | 341/155 |
| 6,894,627 | B2 * | 5/2005 | Janakiraman et al. | 341/102 |
| 6,958,722 | B1 * | 10/2005 | Janakiraman et al. | 341/161 |
| 7,038,609 | B1 * | 5/2006 | Hurrell | 341/156 |
| 7,265,708 | B2 * | 9/2007 | Mitra et al. | 341/172 |
| 7,355,536 | B2 * | 4/2008 | Dempsey et al. | 341/120 |

* cited by examiner

*Primary Examiner*—Lam T Mai
(74) *Attorney, Agent, or Firm*—Warren J. Franz; Frederick J. Telecky, Jr.; Wade J. Brady, III

(57) ABSTRACT

Errors in an analog to digital converter that cause generated digital codes to deviate from expected values are corrected. A sample of an analog signal is stored in a storage element. An error signal is then generated, with the error signal representing a deviation of an expected digital code for the strength of a sample of an analog input from a value that would be generated without correction. The error signal is then added to the stored sample. In an embodiment implemented in the context of a SAR ADC, a digital value representing an integral non-linearity error is generated based on a partial digital code (result of a partial conversion of the sample) and an error coefficient. The digital value is converted to analog form by an auxiliary DAC, and added to the stored input sample.

14 Claims, 5 Drawing Sheets

CORRECTING FOR ERRORS THAT CAUSE GENERATED DIGITAL CODES TO DEVIATE FROM EXPECTED VALUES IN AN ADC

RELATED APPLICATION

The present application claims priority from U.S. provisional patent application Ser. No. 60/888,491 filed on Feb. 6, 2007, naming as inventor Janakiraman Seetharaman, entitled, "A method to correct integral non linearity errors in a successive approximation analog to digital converter", and is incorporated in its entirety herewith.

BACKGROUND

1. Field of the Invention

The present invention relates generally to analog to digital converters (ADC), and more specifically to a technique to correct for errors that cause generated digital codes to deviate from expected values in an ADC.

2. Related Art

Analog to digital converters (ADCs) are used to generate a sequence of digital codes representing the strength of an analog signal at corresponding time instances, and may be implemented according to various techniques such as successive approximation (SAR) ADC, pipelined ADC, etc., as is well known in the relevant arts.

ADCs are generally designed to generate a specific value ("expected value") for a given strength of an analog signal (at the sample time instance). Typically, the ADC is designed to process input signals with a range of strength (often referred as a "dynamic range" of the ADC), and a specific sub-range of strength is associated with each digital code that can be generated by the ADC. The digital code is generally the expected code for the corresponding sub-range of strength.

The digital codes generated by an ADC may deviate from the expected values due to reasons such as non-linearity of various components of an ADC, offset/gain errors, etc., as is well known in the relevant arts. It is generally desirable that the generated digital codes equal the expected values.

SUMMARY OF THE INVENTION

A preferred embodiment of the present invention, accordingly, provides a method of ensuring that an analog to digital converter (ADC) generates expected digital values when processing analog signals. The method comprises storing a sample of an analog signal in a storage element; forming an error signal representing a deviation of an expected digital code for a strength of the sample from a value that would be generated without correction; adding the error signal to the sample of the analog signal in the storage element; and generating a digital value corresponding to a strength of the sample after the adding.

In accordance with another preferred embodiment of the present invention, the storing, the forming, the adding and the generating are performed for each of the samples in the analog signal for which digital values are sought to be generated using the ADC, before the storing stores a corresponding next sample in the storage element.

In accordance with another preferred embodiment of the present invention, the forming comprises: receiving a first partial digital code representing a strength of the sample of the analog signal resolved to a first number of bits less than a number of bits in the digital value, and computing the error signal based on the partial digital code and a first error coefficient, wherein the first error coefficient is comprised in a plurality of error coefficients, wherein each error coefficient in the plurality of error coefficients is specified for a corresponding partial digital code representing a corresponding strength of a sample of the analog signal at a lower resolution compared to the digital value.

In accordance with another preferred embodiment of the present invention, the forming forms the error signal by multiplying a squared value of the partial digital code by the first error coefficient.

In accordance with another preferred embodiment of the present invention, the ADC comprises a first set of capacitors operated according to successive approximation principles (SAP) to determine the digital value, and a first capacitor operated to receive the error signal, wherein the first set of capacitors comprise the storage element, and wherein the storing stores the sample in a sampling phase, wherein the storing is performed before the adding.

In accordance with another preferred embodiment of the present invention, the ADC comprises a successive approximation register (SAR) ADC.

In accordance with another preferred embodiment of the present invention, a SAR ADC converting a sample of an input analog signal into an N-bit digital value is provided. The SAR ADC comprises a comparator providing a comparison result of an intermediate analog signal and a reference voltage; a digital to analog converter (DAC) containing a first set of capacitors storing a sample of the input analog signal, wherein the DAC generates the intermediate analog signal based on a corresponding one of a plurality of intermediate N-bit values and, wherein the first set of capacitors are operated according to SAP to determine the N-bit digital value; a SAR block sending the intermediate N-bit value according to SAP, the SAR block operating to generate a digital output representing a deviation of an expected digital code for a strength of a sample of the analog input signal from a value that would be generated without correction; and an auxiliary DAC receiving the digital output and adding an error signal representing the digital output to the sample of the input analog signal in the first set of capacitors, wherein the SAR block completes generating the N-bit digital value after the auxiliary DAC adds the error signal to the stored sample.

In accordance with another preferred embodiment of the present invention, the SAR ADC further comprising a first capacitor operated to receive the error signal.

In accordance with another preferred embodiment of the present invention, the SAR block generates the N-bit digital value before the first set of capacitors stores a next sample of the input analog signal.

In accordance with another preferred embodiment of the present invention, the SAR block comprises: a SAR logic generating the plurality of intermediate N-bit values; and an error computation block receiving a first intermediate N-bit value contained in the plurality of intermediate N-bit values, and generating the digital output based on the first intermediate N-bit value and an error coefficient, wherein the first intermediate N-bit value represents a partial digital code representing the sample resolved to a first number of bits less than N.

In accordance with another preferred embodiment of the present invention, the error computation block multiplies a squared value of the partial digital code by the error coefficient to generate the digital output.

In accordance with another preferred embodiment of the present invention, the deviation is due to an integral non-linearity error.

In accordance with another preferred embodiment of the present invention, an ADC generating expected digital values when processing analog signals is provided. The ADC comprises means for storing a sample of an analog signal in a storage element; means for forming an error signal representing a deviation of an expected digital code for a strength of the sample from a value that would be generated without correction; means for adding the error signal to the sample of the analog signal in the storage element; and means for generating a digital value corresponding to a strength of the sample after the adding.

In accordance with another preferred embodiment of the present invention, the means for storing, the means for forming, the means for adding, and the means for generating respectively perform the storing, the forming, the adding, and the generating for each of the samples in the analog signal for which digital values are sought to be generated using the ADC, before the means for storing stores a corresponding next sample in the storage element.

In accordance with another preferred embodiment of the present invention, the means for forming comprises: means for receiving a first partial digital code representing a strength of the sample of the analog signal resolved to a first number of bits less than a number of bits in the digital value, and means for computing the error signal based on the partial digital code and a first error coefficient, wherein the first error coefficient is comprised in a plurality of error coefficients, wherein each error coefficient in the plurality of error coefficients is specified for a corresponding partial digital code representing a corresponding strength of a sample of the analog signal at a lower resolution compared to the digital value.

In accordance with another preferred embodiment of the present invention, the means for forming forms the error signal by multiplying a squared value of the partial digital code by the first error coefficient.

In accordance with another preferred embodiment of the present invention, a device comprising: a processor processing a plurality of digital values; and a SAR ADC converting a sample of an input analog signal into an N-bit digital value, the N-bit digital value being comprised in the plurality of digital values is provided. The SAR ADC comprises a comparator providing a comparison result of an intermediate analog signal and a reference voltage; a DAC containing a first set of capacitors storing a sample of the input analog signal, wherein the DAC generates the intermediate analog signal based on a corresponding one of a plurality of intermediate N-bit values and, wherein the first set of capacitors are operated according to SAP to determine the N-bit digital value; a SAR block sending the intermediate N-bit value according to SAP, the SAR block operating to generate a digital output representing a deviation of an expected digital code for a strength of a sample of the analog input signal from a value that would be generated without correction; and an auxiliary DAC receiving the digital output and adding an error signal representing the digital output to the sample of the input analog signal in the first set of capacitors, wherein the SAR block completes generating the N-bit digital value after the auxiliary DAC adds the error signal to the stored sample.

In accordance with another preferred embodiment of the present invention, the SAR ADC further comprises a first capacitor operated to receive the error signal, wherein the SAR block generates the N-bit digital value before the first set of capacitors stores a next sample of the input analog signal.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

An aspect of the present invention ensures that an analog to digital converter (ADC) generates expected digital values when processing analog signals. A sample of an analog signal is stored in a storage element. An error signal representing a deviation of an expected digital code for the strength of the stored sample from a value that would be generated without correction is generated. The error signal is then added to the stored sample, and the ADC generates a digital value corresponding to the strength of the sample after the addition of the error signal.

According to another aspect of the present invention, the error signal is added to the stored sample, and the digital value generated before a next sample is stored.

In an embodiment implemented in the context of a successive approximation (SAR) ADC, a digital output representing an integral non-linearity error of the ADC is generated based on a partial digital code (result of a partial conversion of the sample) and an error coefficient. The digital output is converted to analog form by an auxiliary DAC, and added to the stored input sample.

As the features of the invention pertain to correcting errors in an ADC, a brief illustration of an example desired transfer function of an ADC, as well as an example deviation from the desired transfer function is provided next.

2. ADC

Figure 1:
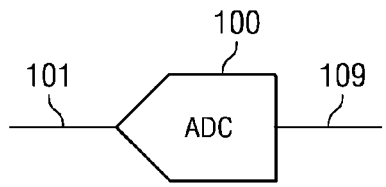
FIG. 1 is a block diagram representing a generic ADC.

FIG. 1 is a block diagram representing a an example ADC in which several aspects of the present invention can be implemented. ADC 100 receives an analog signal on path 101, and provides digital codes representing the signal level (strength, e.g., voltage/current) of the analog signal on path 109.

Figure 2A:
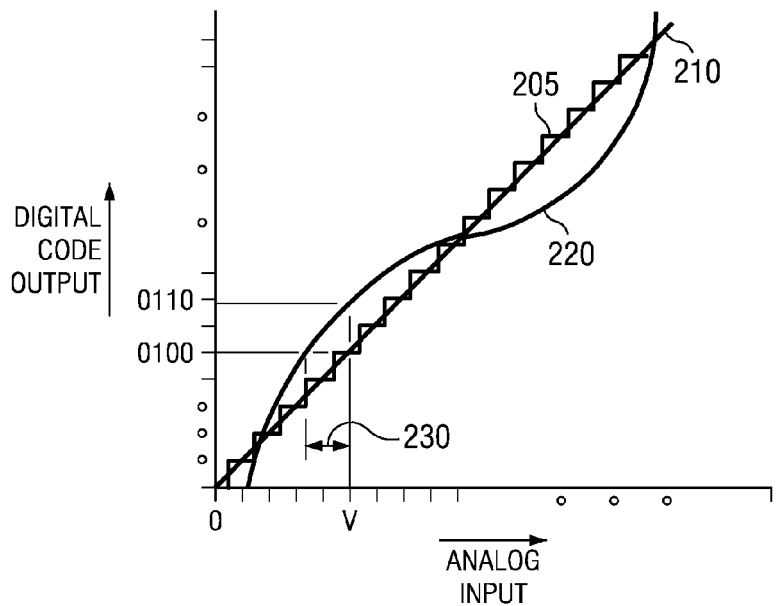
FIGS. 2A and 2B are diagrams illustrating deviations of generated digital codes from expected values in an ADC.

FIG. 2A is a diagram illustrating an example relationship (transfer function) between strengths of analog input 101 (along the x-axis) and the corresponding digital code values (along the y-axis) generated by ADC 100. Merely for ease of description, the diagram is shown assuming ADC 100 operates only on signal strengths of one polarity (positive or negative).

Staircase waveform 205 represents an ideal (desired) transfer function relating the strengths of analog input 101 and corresponding digital codes 109. Line 210 is a simplified representation of staircase waveform 205. Curve 220 represents (simplified as a continuous curve) a transfer function taking into account error sources such as integral (or differential) non-linearity errors, offset errors, gain errors, etc., as noted above.

It may be seen from FIG. 2A that the actual digital codes generated by ADC 100 may deviate from the expected (desired) values. As an illustration, the expected digital code for a strength 'V' of the analog signal 101 is shown in FIG. 2A as binary 0100, as specified by line 210 (or staircase waveform 205). However, the actual digital code generated by ADC 100 maybe 0110 as indicated by curve 210.

In some instances, an amplifier stage may be used to amplify analog signal 101 before providing it to ADC 100. Alternatively, ADC 100 itself may provide a desired amplification. The amplification process may further introduce (contribute to) errors causing generated digital codes to deviate from expected values.

Figure 2B:
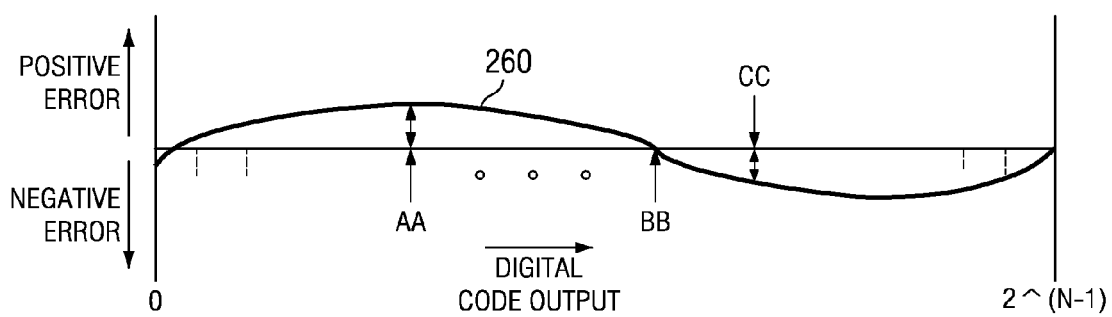

In general, the digital codes generated by an ADC may have errors associated with them as shown by the example error curve of FIG. 2B. In the figure, curve 260 (again shown as a continuous curve for the sake of clarity) represents errors (deviations) in the digital codes from corresponding expected values. It may be seen that the errors may be positive, negative or zero. For example, digital code 'AA' has a positive error, digital code 'BB' has zero error, while digital code 'CC' has a negative error. It must be noted that the error curve for a specific ADC implementation may be different from curve 260.

It is desirable to correct for such deviations in the digital codes from expected values as described next with the help of a flowchart.

3. Correcting for Errors

Figure 3:
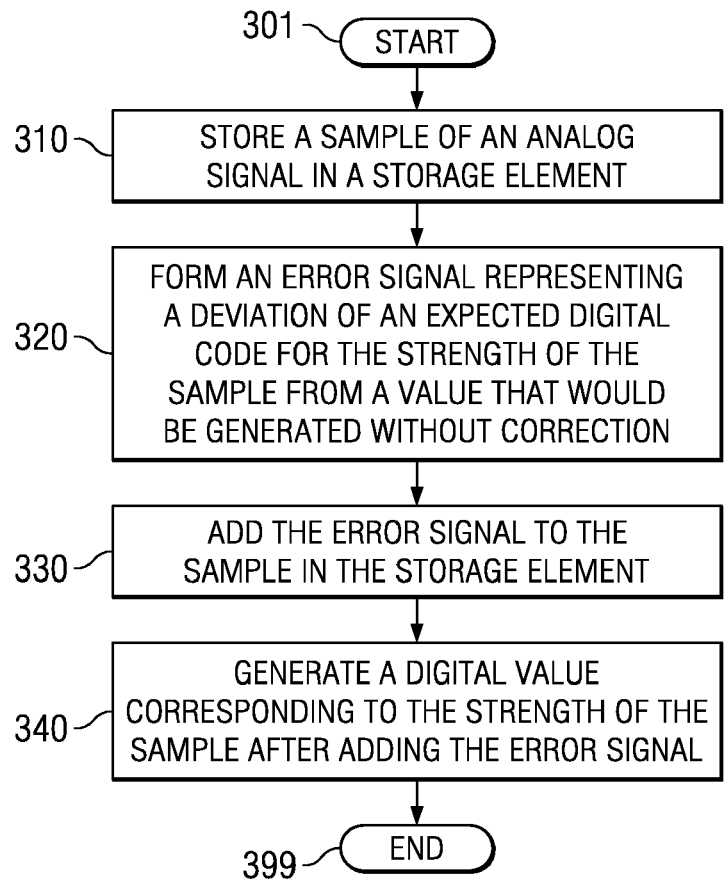
FIG. 3 is a flowchart illustrating the manner in which deviations from expected values in digital codes generated by an ADC can be corrected according to several aspects of the present invention.

FIG. 3 is a flowchart illustrating the manner in which deviations from expected values in digital codes generated by an ADC can be corrected according to several aspects of the present invention. The steps are described in a specific sequence merely for illustration. However, a different sequence of steps can also be implemented without departing from the scope and spirit of several aspects of the present invention, as will be apparent to one skilled in the relevant arts by reading the disclosure provided herein. The flowchart starts in step 301, in which control passes immediately to step 310.

In step 310, a sample of an analog signal is stored in a storage element. In an embodiment described below in the context of a SAR ADC, a sample is stored in a capacitor array. However, depending on the specific implementation of an ADC, other storage elements may be used to store the sample. Control then passes to step 320.

In step 320, an error signal is formed, with the error signal representing a deviation of an expected digital code for the strength of the sample (stored in step 310) from a value that would be generated without correction. As an illustration, with reference to FIG. 2A, the expected digital code generated for strength 'V' of the analog signal is binary 0100. Thus, an error signal corresponding to the amount represented by 230 may be generated. As noted above, the error in the digital code may be positive, negative or zero. Correspondingly, the error signal may also be positive, negative or zero. In an embodiment described below in the context of a SAR ADC, an auxiliary digital to analog converter (auxiliary DAC) receives a digital value representing the error signal and generates a corresponding (analog) error signal. Control then passes to step 330.

In step 330, the error signal is added to the sample stored in the storage element. In an embodiment, the error signal is added to the stored sample during a same conversion operation in which the sample is obtained (stored in step 310). A conversion operation, which may comprise one or more clock cycles, generally refers to a duration in which an ADC samples (or receives a sample of) an input signal and generates a corresponding digital code representing a strength of the sample. Control then passes to step 340.

In step 340, a digital value corresponding to the strength of the sample after adding the error signal (in step 330) is generated. As an illustration, with reference to FIG. 2A, after the addition of an error signal represented by 230, a digital value of binary 0100 (equaling the expected value for strength 'V' of the analog signal) is generated. Control then passes to step 399, in which the flowchart ends.

Thus, an aspect of the present invention corrects for errors that cause the generated digital codes to deviate from expected values in an ADC. The features of the invention implemented in a successive approximation register (SAR) ADC are described in detail below, and will be clearer in comparison to a prior approach not implementing one or more of the features. Accordingly, a brief description of a prior implementation of a SAR ADC is provided next.

4. Prior SAR ADC

Figure 4:
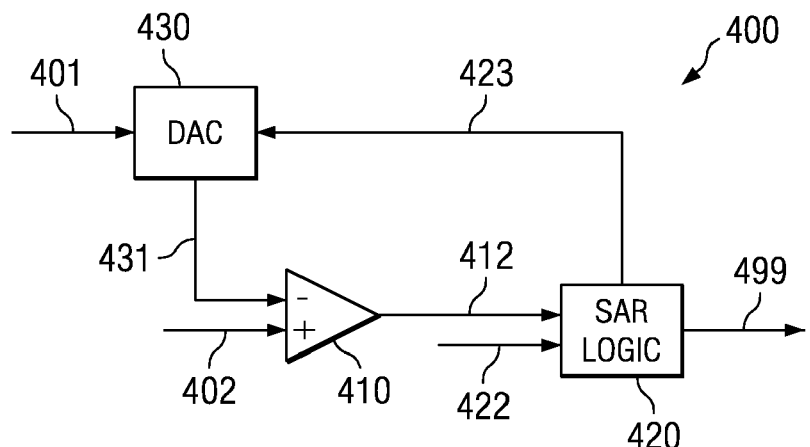
FIG. 4 is a block diagram illustrating the details of a prior embodiment of a SAR ADC.

FIG. 4 is a block diagram illustrating the details of a prior embodiment of a SAR ADC. SAR ADC 400 is shown containing comparator 410, SAR logic 420, and digital to analog converter (DAC) 430. Each component is described in detail below.

Comparator 410 compares an intermediate analog signal on path 431 with a voltage level (reference voltage, Vmid equaling Vdd/2, where Vdd is the power supply voltage to SAR ADC 400) on path 402, and provides the result of the comparison (iteration status) on path 412. In an embodiment, the result equals a logical value '1' if a sample of an analog signal on path 401 is greater than the signal value corresponding to the intermediate digital value (described below), else the result equals a logical value of '0'. Comparator 410 can be implemented in known way.

DAC 430 samples the analog signal received on path 401 before the first iteration. DAC 430 then generates intermediate analog signal 431 having a voltage level equaling (Vmid−Vinp+a voltage level corresponding to an intermediate digital value received on path 423) in each iteration (in which a bit of the digital code is determined), wherein Vinp represents the voltage level of the sampled analog signal.

SAR logic 420 determines the digital code corresponding to a sample (provided on path 401) using successive approximation principles or SAP by interfacing with comparator 410 and DAC 430. In general, SAR logic 420 sends an intermediate digital value during each iteration to determine a bit, and generates the digital code based on the determined bits. The digital code is provided on path 499. Clock 422 controls the duration of each iteration.

The operation of prior DAC (430) and SAR logic (420) combination is described next with reference to FIG. 5.

Figure 5:
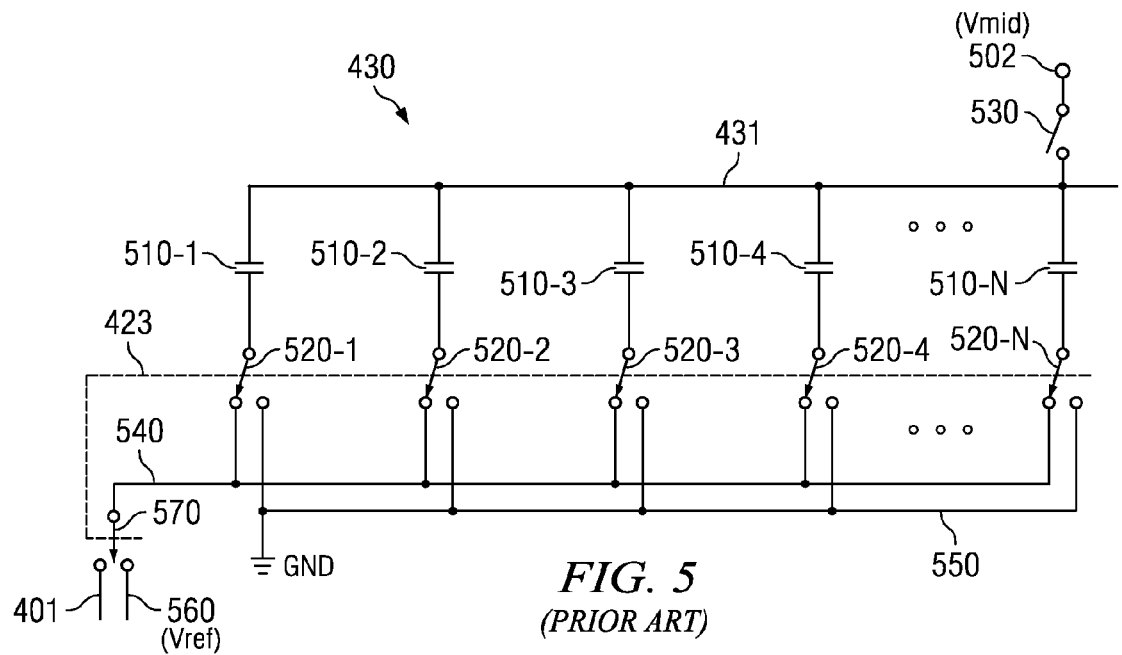
FIG. 5 is a circuit diagram illustrating the details of a DAC portion of a SAR ADC in a prior embodiment.

FIG. 5 is a circuit diagram illustrating the details of DAC 430 (illustrated with reference to paths 401, 423 and 431) in one prior embodiment. As is well known, the input signal (on path 401) is sampled in the sampling phase, and the sample is converted into a digital code in multiple iterations (with one bit determined in each iteration) of the conversion phase.

Continuing with reference to FIG. 5, DAC 430 is shown containing capacitors 510-1 through 510-N, and switches 520-1 through 520-N, 530 and 570. During a sampling phase, switch 530 is closed, switch 570 is connected to path 401 (input signal), and switches 520-1 through 520-N are each connected to path 540, causing the analog signal on path 401 to be sampled on the capacitors.

Consequently, one end of each capacitor (top plate) is connected to Vmid (502) and the other end (bottom plate) is connected to a sample of analog signal on path 401 by a corresponding switch. Capacitors 510-1 through 510-N charge through sample 401 and Vmid 502. The total charge on capacitors represents the sample of the analog signal on path 401, which is ideally given by equation (1):

$$Qs = C*(Vmid - Vinp) \quad \text{Equation 1}$$

wherein C is the total (combined) capacitance of capacitors 510-1 through 510-N, Vinp is the voltage level of the sample (terminal 401), and '*' represents a multiplication operator. Capacitors 510-1 through 510-N may also be referred to as capacitor array 510 in some instance below.

During conversion phase, switch 530 is opened such that the total charge on top plates of the capacitors remains at Qs (of Equation 1, above). The bottom plates of the capacitors are either connected to Vref on path 540 (by connected switch 570 to terminal 560) or ground on path 550 by switches 520-1 through 520-N based on the respective bits of the intermediate digital value (423).

If the voltage on bottom plates of the capacitors is changed, the voltage on top plates would also change in a similar manner to maintain the charge at Qs. Due to the operation of switches 520-1 through 520-N, the voltage on bottom plates of the capacitors is controlled by the intermediate digital value on path 423. Therefore, a change in intermediate digital value causes a similar change in the voltage at top plates (Vtop) on path 431.

Such a change may be used by a SAR logic to determine the digital code corresponding to the sample received on path 401. The detailed operation of SAR logic 420 and of SAR ADC 400 will not be described as being well known in the relevant art.

As noted above, errors such as non-linearity, gain/offset errors etc., maybe present in SAR ADC 400. One source of error is due to a non-linear dependence of the voltage coefficients of the capacitors 510-1 through 510-N, i.e., charge sampled on the capacitors may not be a linear function of the voltage applied across them, but may instead be related by a non-linear relationship such as given below:

$$Q = C*(1 + \alpha*V + \beta*(V)^2) \quad \text{Equation 2}$$

wherein Q is the charge stored on the capacitor, V is the voltage across the capacitor, α and β are constants, ^ represents a 'to the power of' operator.

Although not shown in equation 2, higher order (powers of 3,4 etc) dependence may also be present.

As a result, charge on capacitor array 510 representing the sample of the analog signal on path 401 (which should ideally be governed as in equation 1 above) will instead be related according to the following equation:

$$Qs = C*(1 + \alpha*(Vmid - Vinp) + \beta*(Vmid - Vinp)^2)*(Vmid - Vinp) \quad \text{Equation 3}$$

wherein α and β are first and second order voltage coefficients of capacitance respectively, and ^ represents a 'to the power of' operator.

In general, such a non-linear voltage dependence in a capacitor (such as capacitor array 510) may cause integral non-linearity errors in SAR ADC 400, causing the generated digital codes to deviate from expected values. Several aspects of the present invention overcome some of such problems as described below in detail with examples.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention. Relevant mathematical expressions for the non-linearity errors are first noted in the next section.

5. Theory

The following section provides mathematical expression for integral non-linearity (INL) errors in an ADC for single-ended as well as differential inputs. The analysis/expressions are provided considering only first and second order voltage dependence of capacitance.

Assuming a voltage dependence of capacitor array 510 is given by equation 2, the charge sampled on capacitor array 510 is provided by equation 3, as listed above.

As noted above, bottom plates of some of capacitors 510-1 through 510-N may be connected to Vref, while others may be connected to ground based on the respective bits of the intermediate digital value (423) during a conversion phase (iteration) of SAR ADC 400.

In a conversion phase, charge on path 431 is given by the following equation:

$$Qc = C*(y*(Vmid - Vref) + \alpha(Vmid - Vref)^2 + \beta(Vmid - Vref)^3 + (1-y)(Vmid + \alpha*(Vmid)^2 + \beta*(Vmid)^3)) \quad \text{Equation 4}$$

wherein, y = code/2^N, wherein code is the digital code output (path 499), and N is the resolution (number of output bits in the digital code) of SAR ADC 400.

It may be noted that during a conversion phase y*C is the capacitance in DAC 430 that has a voltage of Vref at the bottom plates, and (1−y)*C is the capacitance that has a voltage zero (ground) at the bottom plates.

Since charge on a node is conserved Qc (given by equation 4) equals Qs (given by equation 3). Equating equations 3 and 4 provides:

$$K*y = P \quad \text{Equation 5}$$

wherein,
K is given by:

$$K = -Vref - 2*\alpha*Vmid*Vref - 3*\beta*(Vmid)^2*Vref + \alpha*(Vref)^2 + 3*\beta*Vmid*(Vref)^2 - \beta*(Vref)^3 \quad \text{Equation 6}$$

and P is given by:

$$P = -Vinp - 2*\alpha*Vmid*Vinp - 3*\beta*(Vmid)^2*Vinp + \alpha*(Vinp)^2 + 3*\beta*Vmid*(Vinp)^2 - \beta*(Vinp)^3 \quad \text{Equation 7}$$

The integral non-linearity error (INL error) of SAR ADC 400 may be expressed by the following equation:

$$INL\ error = [y - (Vinp/Vref)]*2^N \quad \text{Equation 8}$$

The shape of the INL error curve may depend on the reference voltage Vref and Vmid.

Expressions for integral non-linearity error for a differential input SAR ADC (not shown in the diagrams as being well known in the relevant art) are listed next.

Charge sampled on capacitor array is given ideally by the following equation:

$$Qsd = C*(Vmid - Vplus) - C*(Vmid - Vminus) \quad \text{Equation 9}$$

wherein,

Vplus is the voltage at the positive terminal of the differential input terminals.

Vminus is the voltage at the negative terminal of the differential input terminals.

C is the capacitance of each of the two capacitor arrays, with one capacitor array connected to the positive terminal, and the other connected to the negative terminal.

It may be noted from equation 9 that the charge sampled on the capacitor arrays may not be the same if the capacitors are non-linear. Thus, Qs may be expressed instead as:

$$Qsd = C*(Vminus - Vplus)*[1 + 2*A*Vmid + 3*B*(Vmid)^2 + (A + 3*B*Vmid)*(Vminus + Vplus)] \quad \text{Equation 10}$$

wherein A and B are first and second order voltage coefficients of capacitance respectively, and may be equal to coefficients $\alpha$ and $\beta$ noted above.

During a conversion phase, for one capacitor array the capacitance that has a voltage of Vref at the bottom plates may be given as x*C, and the capacitance that has a voltage zero (ground) at the bottom plates as (1−x)*C, and for the other capacitor array, the capacitance that has a voltage of Vref at the bottom plates may be given as (1−x)*C, and the capacitance that has a voltage zero (ground) at the bottom plates as x*C, wherein x=code/2^N, wherein code is the digital code output of the converter with differential inputs, and N is the resolution of the converter.

The charge on the top plates of capacitors in the 'plus' array is given by:

$$Qcp = C*(x*(Vmid - Vref) + A(Vmid - Vref)^2 + B(Vmid - Vref)^3 + (1-x)(Vmid + A*(Vmid)^2 + B*(Vmid)^3)) \quad \text{Equation 11}$$

The charge on the top plates of capacitors in the 'minus' array is given by:

$$Qcm = C*((1-x)*(Vmid - Vref) + A(Vmid - Vref)^2 + B(Vmid - vref)^3 + x*(Vmid + A*(Vmid)^2 + B*(Vmid)^3)) \quad \text{Equation 12}$$

The difference in the charge is expressed by the following equation:

$$Qcd = (2*x - 1)*L \quad \text{Equation 13}$$

wherein L is given by the following equation:

$$L = -Vref - 2*A*Vmid*Vref - 3*B*(Vmid)^2*Vref + A*(Vref)^2 + 3*B*Vmid*(Vref)^2 - B*(Vref)^3 \quad \text{Equation 14}$$

Equating Qsd (equation 10) and Qcd (equation 13) provides an expression for x of the following form:

$$x = (M/L + 1)/2 \quad \text{Equation 15}$$

wherein M is given by the following expression:

$$M = (Vminus - Vplus)*[1 + 2*A*Vmid + 3*B*(Vmid)^2 + (A + 3*B*Vmid)*(Vminus + Vplus)] \quad \text{Equation 16}$$

It may be observed that INL error for differential input may be expressed as:

$$INL\ error(diff) = (x - Vinp/Vref)*2^N, \text{ wherein } Vinp = (Vplus - Vminus) \quad \text{Equation 17}$$

It may be observed from the above that the shape of the INL error curve for differential input does not depend on coefficient A and on Vref, and is sensitive only to coefficient B.

In general, INL error may be expressed by the following equation:

$$INL(z) = \sum_{i=1}^{\infty} a_i * z^i \quad \text{Equation 18}$$

wherein, z=Vin/Vref, wherein Vin is the input voltage, and Vref is the reference voltage, and $a_i$ is a constant which may be obtained from the non-linearity characteristics of the ADC or from amplitudes of harmonics in a spectral response of the ADC by testing.

In an embodiment of the present invention described below, the input voltage is resolved to sufficient accuracy (significant bits) to compute an approximate correction for the non-linearity error. As an example, in a 16-bit SAR ADC, after the input has been resolved to the first ten bits, the input voltage is known to an accuracy of 1/(2^10). The value of the non-linearity error (as given by equation 18) may then be computed, and added to the ADC (the input signal sampled and stored in the ADC) to correct for the error.

Assuming $z_a$ is the approximation of the input signal (equivalent of the 10 resolved bits in the above example), the error in the INL correction is given by the following expression:

$$Error\_INL(z) = \sum_{i=1}^{\infty} a_i * (z - z_a)^i \quad \text{Equation-19}$$

In general, the error in the INL correction reduces as better approximation of the input signal is used. As an example, if a 5-LSB INL error is being corrected in a 16-bit ADC, with the INL error being given by the expression (20*z−20*z*z), where z=Vin/Vref, the error in the INL correction using a 10-bit approximation of the input is approximately ±0.0195 LSB, which maybe negligible.

An example embodiment implementing several aspects of the present invention is described next.

6. Example Embodiment

Figure 6:
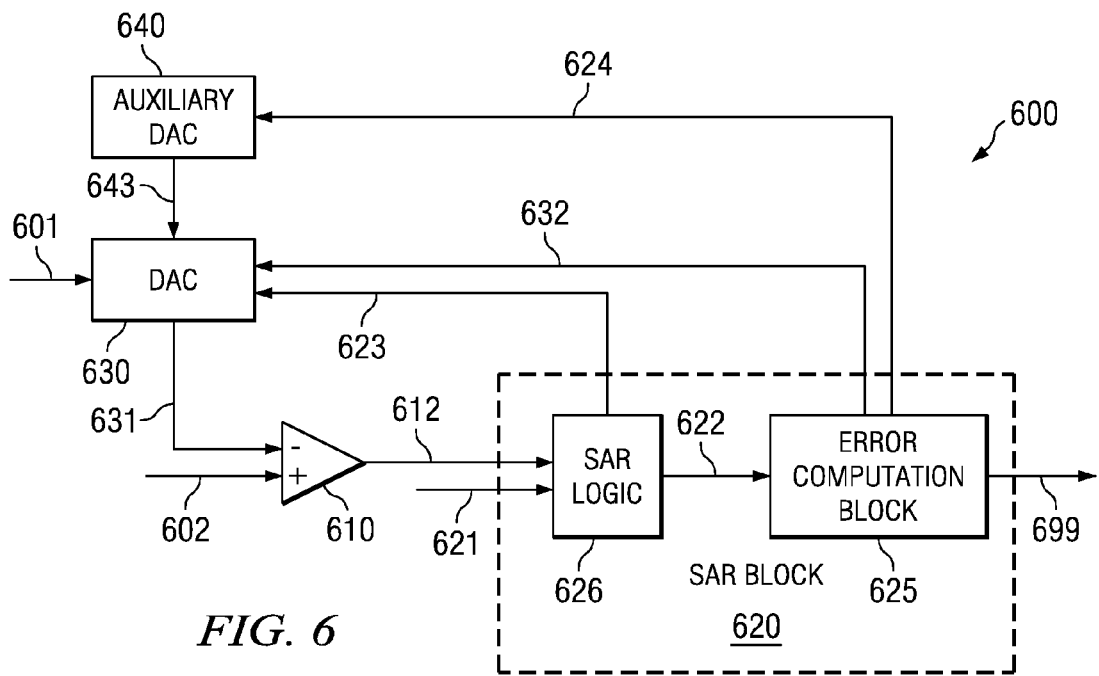
FIG. 6 is a block diagram of a SAR ADC implementing several aspects of the present invention in an embodiment.

FIG. 6 is a block diagram of a SAR ADC implementing several aspects of the present invention in an embodiment. SAR ADC 600, which may be a single-ended input ADC, is shown containing comparator 610, SAR block 620, DAC 630, and auxiliary DAC 640. Although, the description is provided with respect to a single-ended input ADC, the features of the invention may be implemented in an ADC with differential inputs as well, as will be apparent to one skilled in the relevant art. Further, while an embodiment of a SAR ADC is described below, in general various features of the present invention may be implemented in any type of ADC which approximates the input successively, such as for example a pipelined ADC. Each component of SAR ADC 600 is described in detail below.

Comparator 610 compares an intermediate analog signal on path 631 with a voltage level (Vmid equaling Vdd/2, where Vdd is the power supply voltage to SAR ADC 600) on path 602, and provides the result of the comparison (iteration status) on path 612. In an embodiment, the result equals a logical value '1' if a sample of an analog signal on path 601 is greater than the signal value corresponding to the intermediate digital value (described below), else the result equals a logical value of '0'. Comparator 610 can be implemented in known way.

DAC 630 samples the analog signal received on path 601 before the first iteration. DAC 630 then generates intermediate analog signal 631 having a voltage level equaling (Vmid−Vinp+a voltage level corresponding to an intermediate digital value received on path 623) in each iteration (in which a bit of the digital code is determined), wherein Vinp represents the voltage level of the sampled analog signal.

Auxiliary DAC 640 receives a digital output representing an error signal (substantially equaling an INL error) from error computation block 625 contained in SAR logic 620. Auxiliary DAC 640 generates an analog representation (error signal) of the digital value and adds the error signal, via path 643, to the sample of the analog input stored in storage elements (capacitor array(s), as described in detail below) in DAC 630. The digital value/error signal represents a deviation of an expected digital code for the strength of a sample of an analog input from a value that would be generated without INL error correction. In an embodiment, the INL error is determined as given by equation 18, in which the number of terms in the summation as well as the approximation to the input signal may be selected based on a desired correction accuracy.

SAR block 620 is shown containing SAR logic 626 and error computation block 625. SAR logic 626 determines the digital code (provided on path 699) corresponding to a sample (provided on path 601) using successive approximation principle by interfacing with comparator 610, DAC 630 and auxiliary DAC 640. In general, SAR logic 620 sends an intermediate digital value during each iteration to determine a bit, and generates the digital code based on the determined bits. Clock 621 controls the duration of each iteration.

Error computation block 625 receives a partial digital code (from SAR logic 626 via path 622) representing a strength of analog signal 601 resolved to a desired number of most significant bits, and operates to determine an error signal (or a digital value representing an error signal) to correct for INL errors in SAR ADC600. The operation of error computation block 625 in an embodiment is described in detail in sections below.

The operation of DAC 630, auxiliary DAC 640 and SAR logic 620 combination is described next with reference to FIG. 7.

7. Internal Details

Figure 7:
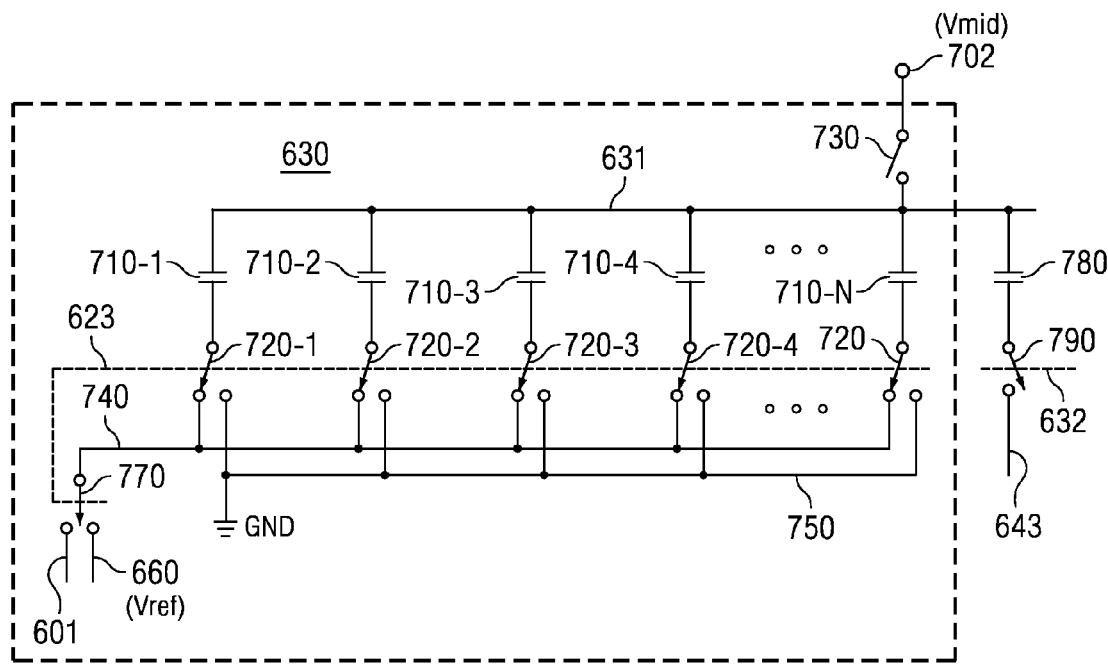
FIG. 7 is a circuit diagram partially illustrating the internal details of an embodiment of a SAR ADC according to several aspects of the present invention.

FIG. 7 is a circuit diagram illustrating the details of DAC 630 (illustrated with reference to paths 601, 623, 631 and 643) in an embodiment. In addition, capacitor 780 and switch 790 are also shown and are described below. As is well known, the input signal (on path 601) is sampled in the sampling phase, and the sample is converted into a digital code in multiple iterations (with one bit determined in each iteration) of the conversion phase.

Continuing with reference to FIG. 7, DAC 630 is shown containing capacitors 710-1 through 710-N, switches 720-1 through 720-N, switches 730 and 740. DAC 630 and constituent components operate in a manner similar to DAC 430 and corresponding constituent components shown in FIG. 5, and the description is not repeated here in the interest of conciseness.

When switch 790 is closed, capacitor 780 is charged by an error signal generated by auxiliary DAC 640 (FIG. 6) and provided on path 643. Switch 790 may be closed, and the error signal provided on path 643 at the end of an approximate determination of the value of the analog input on path 601. For example, the error signal may be generated (and provided) to charge capacitor 780 when the analog input has been resolved to a desired number of most significant bits (MSBs). Switch 790 may be controlled by error computation block 625 via path 632.

The manner in which error computation block 625 determines a digital value representing an INL error signal is described next with respect to flowchart.

8. Operation of Error Computation Block

Figure 8:
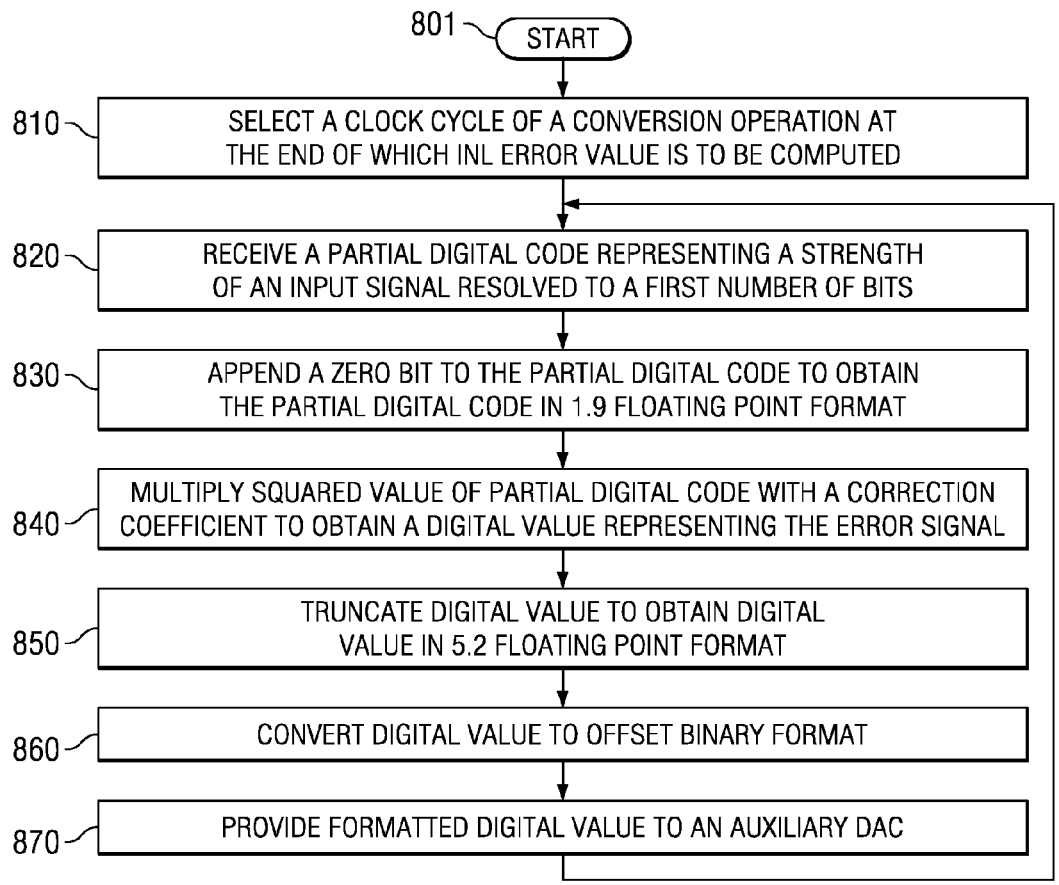
FIG. 8 is a flowchart illustrating the operation of an error computation block implemented within a SAR ADC according to an aspect of the present invention.

FIG. 8 is a flowchart illustrating the manner in which error computation block 625 determines a digital output representing an error signal to correct for INL errors in an embodiment. The flowchart is described with respect to FIGS. 6 and 7 merely for illustration. Various features can be implemented in other environments and with other components as well. The steps are described in a specific sequence merely for illustration. However, one or more steps may be executed simultaneously depending on the specific implementation of error computation block 625.

Alternative embodiments in other environments, using other components, and different sequence of steps can also be implemented without departing from the scope and spirit of several aspects of the present invention, as will be apparent to one skilled in the relevant arts by reading the disclosure provided herein. The flowchart starts in step 801, in which control passes immediately to step 810.

In step 810, error computation block 625 selects a clock cycle of a conversion operation at the end of which INL error value is to be computed. A conversion operation, which may span one or more clock cycles, generally refers to a duration in which SAR ADC 600 samples (or receives a sample of) an input signal and generates a corresponding digital code representing a strength of the sample. The specific clock cycle to be selected may be specified in a programmable form or be hard coded in the design of error computation block 625. In an embodiment, error computation block 625 selects the (end of the) ninth clock cycle of a conversion operation as illustrated with respect to a timing diagram below. Control then passes to step 820.

In step 820, error computation block 625 receives a partial digital code representing a strength of an input signal resolved to a first number of bits. To illustrate, assuming SAR ADC 600 is an N-bit converter (provides an N-bit final digital code representing an input analog signal/sample), the partial digital code received may also contain N-bits, but with only a (pre-determined) number of most significant bits, for example M (M being less than N), carrying information (representing the partially resolved input), while the rest of the bits may be at a fixed level (logic 0 or 1). With respect to FIG. 6, error computation block 625 receives the strength of input 601 resolved to the nine MSBs. Control then passes to step 830.

In step 830, error computation block 625 appends (prefixes) a zero to the partial digital code to obtain the partial digital code in 1.9 floating point format. Control then passes to step 840.

In step 840, error computation block 625 multiplies the squared value of the partial digital code obtained in step 830 by a coefficient to obtain a digital output representing an INL error signal. Assuming the partial digital code is denoted by 'x', error computation block 625 computed an INL error signal as given by the following relation:

INL error signal=a*(x^2), wherein 'a' is the value of the coefficient (INL correction coefficient) corresponding to the value of the partial digital code.

As noted in section above, the value of the coefficient may be determined from the non-linearity characteristics of SAR ADC 600, or from amplitudes of harmonics in a spectral response of the SAR ADC 600 determined by testing. Error computation block 625 may store a set of coefficients, with coefficient corresponding to a specific value of the partial digital code. The coefficients may be stored in error computation block 625, and may either be hard coded (fixed values) or be user programmable. The manner in which the values the coefficients may be determined in one embodiment is described below. Control then passes to step 850.

In step 850, truncates the digital output representing the error signal to obtain the digital output in 5.2 two's complement floating point format. Control then passes to step 860.

In step 860, error computation block 625 converts the digital output obtained in step 850 to offset binary format to obtain a digital value representing the input signal, with the digital value substantially equaling the expected digital value. Control then passes to step 870.

In step 870, error computation block 625 provides the digital value obtained in step 860 to auxiliary DAC 640. Control then passes to step 820, in which error computation block 625 receives another partial digital code representing the strength of a next sample of the analog input.

Although the foregoing description was provided with respect to INL errors, the digital output can be computed to correct for other error types such as gain and offset errors as well. In general, deviation of generated digital codes from expected values due to such error types (including errors contributed by an amplifier stage preceding SAR ADC 600 or due to amplification by SAR ADC 600 itself) may be determined as described above, and appropriate error signals may be generated.

The operations of the steps described above are further illustrated next with a timing diagram.

9. Timing Diagram

Figure 9:
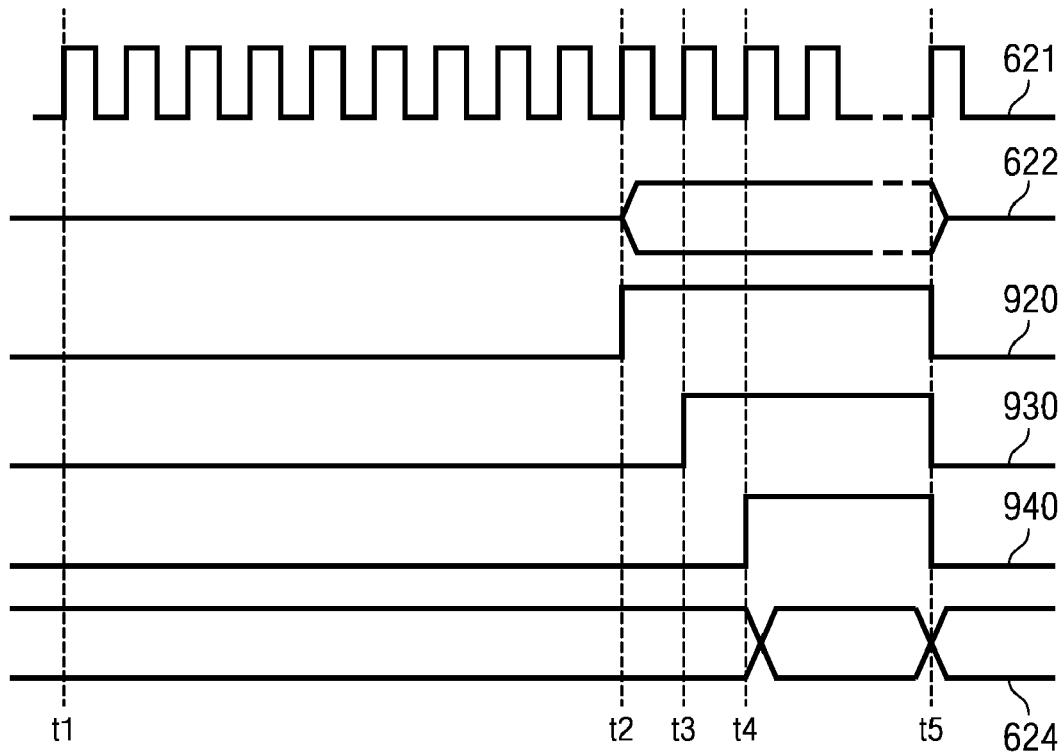
FIG. 9 is a timing diagram illustrating the manner in which INL error correction is applied in an embodiment of the present invention.

FIG. 9 is a timing diagram illustrating the manner in which INL error correction is applied in one embodiment.

Waveform 621 represents a clock signal that controls operations of SAR ADC 600. Waveform 622 represents a partial digital code received by error computation block 625. Waveforms 920 and 930 respectively represent a 'START' and a 'SELECT' signal used in computing an INL error signal, and may be generated internally in error computation block 625. Waveform 940 represents an 'APPLY' signal specifying a time instance at which an INL correction is to be provided to auxiliary DAC 640. Waveform 624 represents the digital output provided by error computation block 625 to auxiliary DAC 640.

A conversion operation is shown commencing at time instance t1. At time instance t2 the most significant 9 bits (partial digital code) representing a strength of input 601 are available and provided by SAR logic 625 to error computation block 625. It may be observed that the partial digital code is provided at the end of the ninth clock cycle of the conversion operation.

At time instance t2, the START signal (920) is asserted (high) indicating that computation of INL error may be commenced. The 'SELECT' signal (logic 0 at t2) selects a corresponding INL error coefficient, and a product of the 9-bit partial digital code and an error coefficient is formed. Thus, assuming the 9-bit partial digital code is represented by x, and the error coefficient is represented as 'a', an intermediate digital output a*x is obtained. The intermediate digital output a*x is truncated to obtain the value in 5.2 floating point 2's complement format. Error coefficients (including 'a') may be stored in an error coefficient table (not shown) in SAR block 620, and the partial digital code may be used as an address to retrieve the corresponding error coefficient.

One clock cycle later, at time instance t3, the 'SELECT' signal goes to logic 1, and the intermediate digital output a*x is multiplied by 'x' (the 9-bit partial digital code), and a digital output a*x^2 representing the error signal is obtained.

Another clock cycle later, at time instance t4, the digital output a*x^2 is provided to auxiliary DAC 640. Auxiliary DAC 640 then provides an analog equivalent of a*x^2 to correct for the INL error as described above. The manner in which error coefficients may be determined is described next.

10. Determining INL Correction Coefficients

The following description is provided assuming that INL error is expressed in the form noted in equation 20 given below, however similar approaches may followed for INL errors expressions involving fewer or more (higher order) terms.

$$INL(y)=a*y*(b-y)*(1-y) \qquad \text{Equation 20}$$

wherein, y=code/2^N, wherein code is the digital code output representing a strength of an analog input signal and N is the resolution of the converter.

Coefficient 'b' may be determined by noting the values of y for which INL(y) has a value of zero. For the INL error given in equation 20, the value for y (other than 0 and 1) for which INL(y) has a value zero, provides the value of coefficient 'b'.

Once the value of 'b' is determined, the value of 'a' can be determined by applying the value of INL(y) for a corresponding value of y other than 0, 1 and b, and substituting the values in equation 20.

In general, INL error coefficients may be determined mathematically from the shape/expression of the INL error curve.

Figure 10:
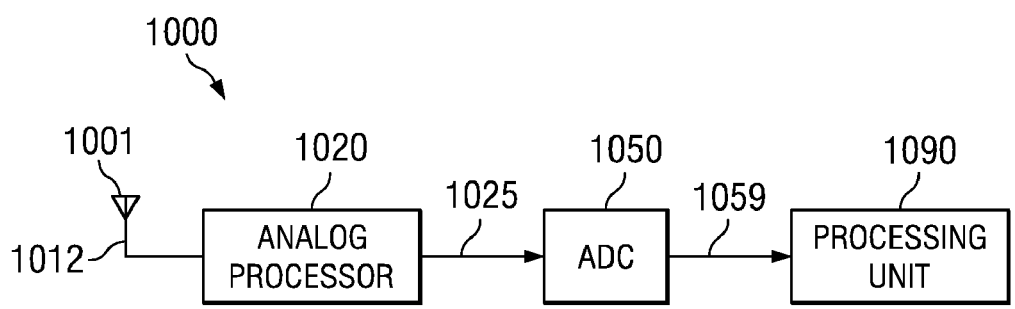
FIG. 10 is a block diagram of an example system in which the present invention may be implemented.

An ADC implemented according to several aspects of the present invention may be incorporated in a system/device. Accordingly, the description is continued with reference to an example system in which various aspects of the present invention can be implemented 11. System/Device FIG. 10 is a block diagram of receiver system 1000 illustrating an example system in which the present invention may be implemented. Receiver system 1000, which may correspond to, for example, a mobile phone is shown containing antenna 1001, analog processor 1020, ADC 1050, and processing unit 1090. Each component is described in further detail below.

Antenna 1001 may receive various signals transmitted over a wireless medium. The received signals may be provided to analog processor 1020 on path 1012 for further processing. Analog processor 1020 may perform tasks such as amplification (or attenuation as desired), filtering, frequency conversion, etc., on received signals and provides the resulting signal on path 1025. The processed signal may be provided to ADC 1050 on path 1025.

ADC 1050 converts the analog signal received on path 1025 to a corresponding digital value. The digital value may be provided to processing unit 1090 on path 1059 for further processing. ADC 1050 may be implemented in a manner described above. Processing unit 1090 receives the recovered data to provide various user applications (such as telephone calls, data applications).

Thus, various aspects of the present invention described above can be used to correct for errors that cause generated digital codes to deviate from ideal values in an analog to digital converter (ADC).

In addition, various modifications can be made to the embodiments/approaches described above without departing from the scope and spirit of various aspects of the present invention. For example, the DACs are shown implemented using capacitors, however, the DACs can be implemented in several other ways as is well known in relevant arts.

Similarly, even though the description of above is provided with reference to single-ended circuits, the approaches described above can be extended to differential circuits, as will be apparent to one skilled in the relevant arts by reading the disclosure provided herein. Such embodiments are contemplated to be covered by various aspects of the present invention.

12. Conclusion

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. A method comprising:
   storing a sample of an analog signal in a storage element;
   receiving a partial digital code representing a strength of the sample of said analog signal resolved to a first number of bits less than a number of bits in a digital value;
   computing an error signal based on the partial digital code and a first error coefficient, wherein the first error coefficient is comprised in a plurality of error coefficients, wherein each error coefficient in the plurality of error coefficients is specified for a corresponding partial digital code representing a corresponding strength of the sample of the analog signal at a lower resolution compared to the digital value;
   adding the error signal to the sample; and
   generating the digital value corresponding to the strength of the sample after the step of adding.

2. The method of claim 1, further comprising step of: forming the error signal by multiplying a squared value of the partial digital code by the first error coefficient.

3. The method of claim 2, further comprising step of: operating a first set of capacitors according to successive approximation principles (SAP) to determine the digital value, wherein the first set of capacitors comprise the storage element; and
   receiving the error signal by a first capacitor.

4. The method of claim 1, further comprising step of: employing a successive approximation register (SAR) analog to digital converter (ADC).

5. An apparatus for converting a sample of an input analog signal into an N-bit digital value, the apparatus comprising:

a comparator that compares an intermediate analog signal and a reference voltage;
   a digital to analog converter (DAC) having a first set of capacitors that store a sample of the input analog signal, wherein the DAC generates the intermediate analog signal based on a corresponding one of a plurality of intermediate N-bit values, and wherein the first set of capacitors are operated according to SAP to determine the N-bit digital value;
   SAR logic that generates the plurality of intermediate N-bit values;
   an error computation block that generates a digital output representing a deviation of an expected digital code for a strength of a sample of the analog input signal from a value that would be generated without correction based on at least one of the intermediate N-bit values and an error coefficient; and
   an auxiliary DAC receiving the digital output and adding an error signal representing the digital output to the sample of the input analog signal in the first set of capacitors, wherein the SAR logic completes generating the N-bit digital value after the auxiliary DAC adds the error signal to the stored sample.

6. The apparatus of claim 5 further comprising a first capacitor operated to receive the error signal.

7. The apparatus of claim 6, wherein the SAR logic generates the N-bit digital value before the first set of capacitors stores a next sample of the input analog signal.

8. The apparatus of claim 7 wherein the error computation block that receives a first intermediate N-bit value within the plurality of intermediate N-bit values and wherein the first intermediate N-bit value represents a partial digital code representing the sample resolved to a first number of bits less than N.

9. The apparatus of claim 8, wherein the error computation block multiplies a squared value of the partial digital code by the error coefficient to generate the digital output.

10. The apparatus of claim 9, wherein the deviation is due to an integral non-linearity error.

11. An ADC comprising:
    means for storing a sample of an analog signal in a storage element;
    means for receiving a partial digital code representing a strength of the sample of the analog signal resolved to a first number of bits less than a number of bits in a digital value;
    means for computing an error signal based on the partial digital code and a first error coefficient, wherein the first error coefficient is comprised in a plurality of error coefficients, wherein each error coefficient in the plurality of error coefficients is specified for a corresponding partial digital code representing a corresponding strength of the sample of the analog signal at a lower resolution compared to the digital value;
    means for adding the error signal to the sample; and
    means for generating the digital value corresponding to a strength of the sample after the error signal and the sample are added.

12. The ADC of claim 11, further comprising means for forming the error signal by multiplying a squared value of the partial digital code by the first error coefficient.

13. The ADC of claim 12, further comprising a first set of capacitors operated according to successive approximation principle; SAP to determine the digital value, and a first capacitor operated to receive the error signal, wherein the first set of capacitors comprise the storage element, and wherein the means for storing stores the sample in a sampling phase, wherein the storing is performed before adding.

14. The ADC of claim 11 wherein the ADC comprises a successive approximation register SAR ADC.

* * * * *